(12) United States Patent
De Vries et al.

(10) Patent No.: US 9,610,602 B2
(45) Date of Patent: Apr. 4, 2017

(54) MANUFACTURING FACILITY AND METHOD OF MANUFACTURING

(71) Applicant: Nederlandse Organisatie voor toegepast-natuurwetenschappelijk onderzoek TNO, Delft (NL)

(72) Inventors: Ike Gerke De Vries, Delft (NL); Hieronymus Antonius Josephus Maria Andriessen, Delft (NL); Arjan Langen, Delft (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 279 days.

(21) Appl. No.: 14/376,955

(22) PCT Filed: Feb. 6, 2013

(86) PCT No.: PCT/NL2013/050063
§ 371 (c)(1),
(2) Date: Aug. 6, 2014

(87) PCT Pub. No.: WO2013/119110
PCT Pub. Date: Aug. 15, 2013

(65) Prior Publication Data
US 2015/0037506 A1      Feb. 5, 2015

(30) Foreign Application Priority Data
Feb. 7, 2012    (EP) .................................... 12154222

(51) Int. Cl.
*B05B 13/02*    (2006.01)
*H01L 21/67*    (2006.01)
(Continued)

(52) U.S. Cl.
CPC ...... *B05B 13/0221* (2013.01); *B05B 13/0207* (2013.01); *B05C 9/08* (2013.01);
(Continued)

(58) Field of Classification Search
None
See application file for complete search history.

(56) References Cited

U.S. PATENT DOCUMENTS

| | | | |
|---|---|---|---|
| 2,894,483 A | 7/1959 | Stahl | |
| 4,043,495 A * | 8/1977 | Sander | B29C 47/34 242/615.12 |

(Continued)

FOREIGN PATENT DOCUMENTS

| | | |
|---|---|---|
| JP | S57107267 A | 7/1982 |
| JP | H0237775 | 3/1990 |

(Continued)

OTHER PUBLICATIONS

Written Opinion of International Search Report, 2014.*
International Search Report—PCT/NL2013/050063—Mailing date: Apr. 25, 2013.

*Primary Examiner* — Charles Capozzi
(74) *Attorney, Agent, or Firm* — Banner & Witcoff, Ltd.

(57) ABSTRACT

A manufacturing facility is provided for manufacturing a product on a foil (FO). The manufacturing facility comprises a deposition zone (10) formed by a clean room wherein at least a first and a second deposition facility (21, 22) are arranged for depositing a layer of a material on the foil. The manufacturing facility further comprises at least one processing facility (31) for processing the deposited layer, said processing facility being arranged outside said deposition zone and comprising a processing trajectory with a first path (31*a*) away from said deposition zone, towards a turning (Continued)

facility (41) and with a second path (31*b*) from said turning facility back towards said deposition zone.

15 Claims, 9 Drawing Sheets (51) Int. Cl.
    *B05C 9/08*  (2006.01)
    *B05C 9/14*  (2006.01)
    *B05D 1/38*  (2006.01)
    *B05D 3/02*  (2006.01)
(52) U.S. Cl.
    CPC ............. *B05C 9/14* (2013.01); *B05D 1/38* (2013.01); *B05D 3/0254* (2013.01); *H01L 21/6719* (2013.01); *H01L 21/67173* (2013.01)

(56) References Cited

U.S. PATENT DOCUMENTS

| | | | | |
|---|---|---|---|---|
| 4,380,211 A * | 4/1983 | Shinohara | ............. | C23C 14/564 118/715 |
| 5,031,850 A * | 7/1991 | Biagiotti | ................ | B65H 19/22 242/521 |
| 2005/0224551 A1 * | 10/2005 | Hein | ..................... | B65H 23/038 226/190 |
| 2005/0249875 A1 * | 11/2005 | Sasaki | .................. | C23C 14/562 427/248.1 |
| 2006/0117988 A1 * | 6/2006 | Mikhael | ................... | B22F 9/16 106/1.05 |
| 2011/0139072 A1 * | 6/2011 | Tamagaki | ............... | C23C 14/24 118/718 |
| 2011/0274828 A1 | 11/2011 | Nagamatsu | | |

FOREIGN PATENT DOCUMENTS

| | | |
|---|---|---|
| JP | 2000093870 A | 4/2000 |
| JP | 2002001196 A | 1/2002 |
| JP | 2005212980 A | 8/2005 |
| JP | 2008083244 A | 4/2008 |
| JP | 2010046647 A | 3/2010 |
| JP | 2010182621 A | 8/2010 |
| JP | 2010188229 A | 9/2010 |
| WO | 02/31216 A2 | 4/2002 |
| WO | 2005116552 A1 | 12/2005 |
| WO | 2011/028119 A1 | 3/2011 |

\* cited by examiner

MANUFACTURING FACILITY AND METHOD OF MANUFACTURING

CROSS-REFERENCE TO RELATED APPLICATIONS

This application is a U.S. National Stage application under 35 U.S.C. §371 of International Application PCT/NL2013/050063 (published as WO 2013/119110 A1), filed Feb. 6, 2013, which claims priority to Application EP 12154222.9, filed Feb. 7, 2012. Benefit of the filing date of each of these prior applications is hereby claimed. Each of these prior applications is hereby incorporated by reference in its entirety.

BACKGROUND OF THE INVENTION

Field of the Invention

The present invention relates to a manufacturing facility.

The present invention further relates to a method of manufacturing.

Related Art

Roll to roll processing has proven to be a very effective way of manufacturing foil based products. Examples of such products are opto-electrical products, such as (O)Leds, displays, electrochrome devices and photovoltaic devices. Other examples of such products are batteries, organic circuitry etc. Such roll to roll processing typically involves the deposition of various, possibly patterned, functional layers and processing those layers, for example for curing or drying. It is desirable that the manufacturing facility can be easily configured to enable manufacturing of different products or different variations of a product. It is also desirable that the requirements for clean room facilities are modest. In order to facilitate rapid development of new products, it is also desirable that easy up-scaling of a production line is possible by adding elements when needed and without the need of a rearrangement of the already existing configuration of the production line. At last, for more advanced products (e.g. for $2^{nd}$ and 3th generation of products), it is desirable that extra deposition and processing steps can be easily added to the configuration.

It is noted that WO 2005/116552 discloses an apparatus for coating a support film with a pharmaceutical agent, in particular, for the production of plasters with transdermal action. The apparatus comprises an unwinding station for the support film, an application station for the application of liquid or pasty pharmaceutical agent to the support film, a drying station for drying the applied agent on the support film and a winding station for the coated support film. The device comprises an application module and at least one drying module arranged adjacently, whereby the application module contains the unwinding station, the application station and the winding station, whilst a drying module or several drying modules in line form the drying station.

SUMMARY OF THE INVENTION

According to a first aspect of the present invention a manufacturing facility is provided as claimed in claim 1. In the manufacturing facility according to the present invention the at least one processing facility for processing is arranged outside the deposition zone. Furthermore, the processing facility comprises a processing trajectory with a first path in a first direction away from the deposition zone, towards a turning facility and with a second path from said turning facility back towards said deposition zone. In this way the at least a first and the second deposition facility can be placed close to each other in a relatively compact space. This facilitates an adaptation of the manufacturing process by skipping one or more of the deposition facilities, as the foil does not have to be guided unnecessary over large distances when one or more of the deposition facilities are not in use. Also the length and the composition of a processing trajectory between subsequent deposition steps can be easily adapted without requiring a rearrangement of the deposition facilities, as the processing trajectory extends in directions transverse to that of the trajectory followed by the deposition steps. If required, the manufacturing facility can be easily extended by adding one or more deposition and drying facilities. The adaptable nature of the manufacturing facility according to the present invention facilitates manufacturing different products and/or different varieties of a product. The freedom of extending the length of the drying trajectory facilitates an adaptation of the processing speed. If a higher processing speed is desired, the processing length can be freely extended, so that the effective processing time remains sufficiently long to achieve the desired processing effect. In an embodiment of the manufacturing facility a side of the foil having the deposited layer(s) is faced upwards (topside) in the processing trajectories. Advantage of this configuration is that the substrate always can be supported on the backside to prevent sagging due to gravity and to enhance web stability.

In an embodiment of the manufacturing facility according to the first aspect the deposition zone is a clean room having an exit and an entry, wherein said first path leads in a first direction away from said exit and leads back towards said entry.

Due to the compact arrangement of the deposition facilities in the deposition zone the clean room defining the deposition zone can be relatively small. This facilitates maintaining the relatively strict environmental requirements for such deposition facilities so that the requirements for clean room facilities are modest.

According to a second aspect of the present invention a method for manufacturing a product on a foil is provided as claimed in claim 15.

It is noted that WO02/31216A2 describes a sputter coating apparatus that includes at least a first sputter coating line and a second sputter coating line. The first and second sputter coating lines may be operated in parallel with one another in certain embodiments in order to independently form coating systems and respective coated articles. However, the two coating lines may also be utilized so as to operate in series with one another to form a coated article. In the latter case, a transition zone is provided between an end of the first line and an end of the second line so as to selectively couple an output of the first line to an input of the second line when it is desired to utilize the two sputter coating lines in series with one another. WO02/31216A2 does not describe a roll-roll manufacturing facility comprising a compact arrangement of various deposition stations in a common conditioned space.

BRIEF DESCRIPTION OF THE DRAWINGS

These and other aspects are described in more detail with reference to the drawing. Therein:

FIG. 5A shows a detail according to view VA in FIG. 5.

DETAILED DESCRIPTION OF EMBODIMENTS

Like reference symbols in the various drawings indicate like elements unless otherwise indicated.

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

It will be understood that when an element "coupled to" another element or layer, it can be directly coupled to the other element or intervening may be present. In contrast, when an element is referred to as being "directly connected to" or "directly coupled to" another element there are no intervening elements or layers present.

It will be understood that, although the terms first, second, third etc. may be used herein to describe various elements, components or zones, these elements, components or zones should not be limited by these terms. These terms are only used to distinguish one element, component, or zone from another region, layer or zone. Thus, a first element, component, zone discussed below could be termed a second element, component, zone without departing from the teachings of the present invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

In the following description examples of the present invention are described. For comparison first a manufacturing not according to the present invention is described with reference to FIG. 1.

Figure 1:
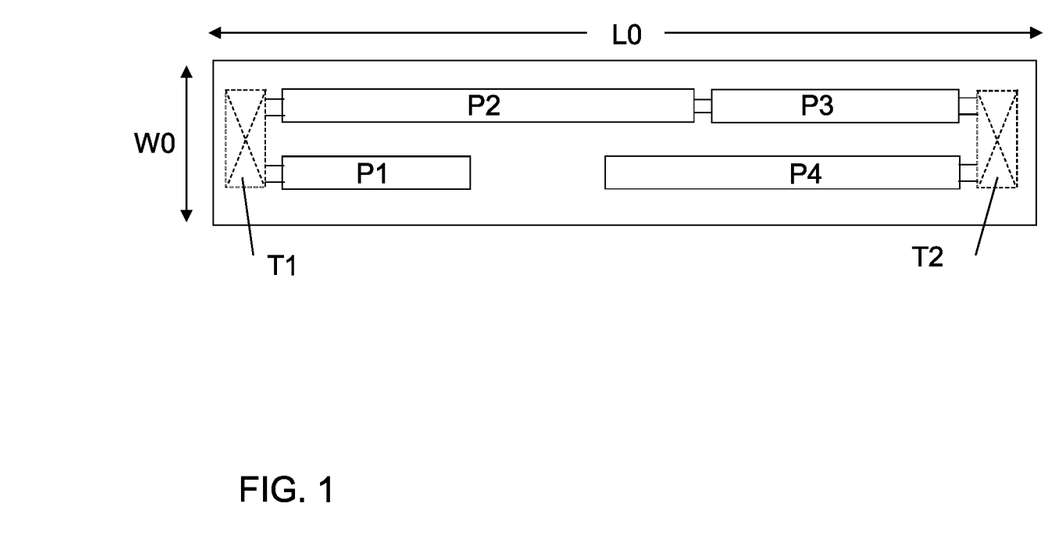
FIG. 1 shows a manufacturing facility not according to the invention.

Currently R2R (pilot) systems as illustrated in FIG. 1 are constructed in such a way that all manufacturing steps are carried out in a single manufacturing space. As the manufacturing typically includes deposition steps that require a high quality clean room environment, the entire manufacturing space needs to comply with this requirement, which is expensive. In the example the manufacturing space has a length L0 of 50 m and a width W0 of 10 m. In the manufacturing space a plurality of roll to roll manufacturing facilities P1, P2, P3, P4 are arranged that are mutually coupled. In the example a foil subject to the manufacturing process is guided from manufacturing facilities P1, via a turning facility T1, e.g. comprising air flotation bearings, to a manufacturing facility P2, a manufacturing facility P3, and via a second turning facility T2 to a manufacturing facility P4. The manufacturing facilities are for example a first deposition line P1, a second deposition line P2 for water based deposition, a third deposition line P3 for solvent based deposition and a fourth deposition line for patterned deposition P4. The deposition lines P1, ... P4, each comprise a deposition facility for depositing a layer and a processing facility, e.g. for curing or drying the deposited layer.

In the R2R system illustrated in FIG. 1 it is difficult to change a combination in which the deposition lines are used. For example if deposition lines P1 and P3 have to be used, the web (foil) always has to pass though process P2 with extra material losses and the risk of additional contamination.

A further drawback of a layout as shown in FIG. 1 is, that the complete deposition lines have to be placed into a clean room environment (for example 10.000 class). For process lines, which have a footprint of 4×50 m, this becomes very expensive. For the processing of OLED and OPV devices, locally the cleanliness level has to be better than class 1000 (maybe even 100 or 10). This can only be achieved by enclosure of each R2R system and each connection between the systems.

Figures 2, 2A:
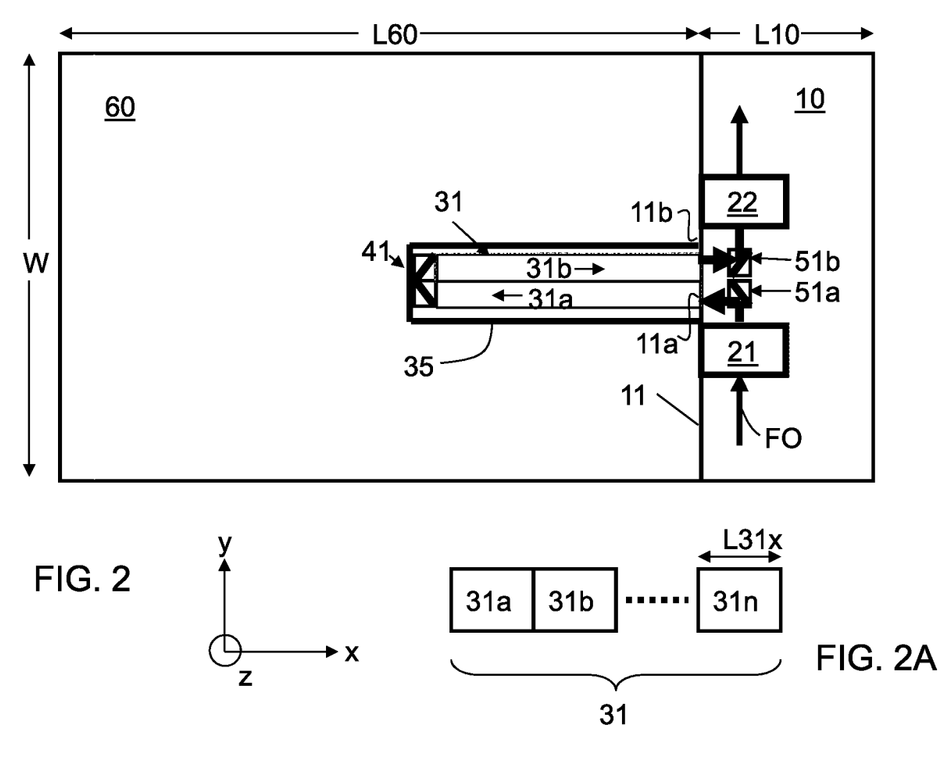
FIG. 2 shows a first embodiment of a manufacturing facility according to the present invention.
FIG. 2A shows a detail in an embodiment of said first embodiment

FIG. 2 shows a first embodiment of a manufacturing facility for manufacturing a product on a foil FO according to a first embodiment of the present invention. The manufacturing facility comprises a deposition zone 10, wherein at least a first and a second deposition facility 21, 22 are arranged for depositing a layer of a material on the foil FO. The manufacturing facility further comprises at least one processing facility 31 for processing the deposited layer. The processing facility 31 is arranged in a processing zone 60 outside the deposition zone 10.

In the embodiment shown the deposition zone 10 is defined as a clean room, separated from the processing zone by a wall 11.

The processing facility 31 comprises a processing trajectory with a first path 31a in a first direction (−x) away from an exit 11a through the wall 11 of the clean room 10, towards a turning facility 41. The processing facility 31 comprises a second path 31b in second direction (+x) from said turning facility back 41 towards an entry 11b of said clean room. The foil is redirected in a first redirection facility 51a in a direction transverse to its original direction from the deposition facility 21 towards the exit 11a in the wall. A second redirection facility 51b guides the foil in a direction transverse to its original direction from the entry 11b in the wall 11 to the second deposition facility. The first and/or the second deposition facility 21, 22 include a deposition unit, for example a printing facility, such as an ink jet printer, a flexo printer, a gravure printer, an offset printer, a rotary screen printer or a coating facility for slot coating, die coating, kiss coating, or spray coating for example.

In an alternative embodiment the deposition zone 10 and the processing zone 60 are not physically separated but are enclosed in a shared clean room.

The processing facility serves to process the layer deposited on the foil by the deposition facility. Typical examples of the processing facility are a drying facility, a sintering facility, an annealing facility, a curing facility a fusing facility, and an ablation facility. Such processing facilities generally introduce (dust) particles. The arrangement of these facilities outside the clean room prevent that these particles enter the clean room. In the arrangement of the processing facility with a first path 31a away from the clean room towards a turning facility and with a second part 31b back to the clean room 10, the direction (−x,x) in which the processing facility extends is transverse to the direction (y) in which the deposition path extends, i.e. the path along which the deposition facilities 21, 22 are arranged. This makes it possible to easily change the length of the processing facility 31, if necessary, without changing the configuration of the deposition facilities 21, 22. Furthermore as the process facilities 31 are arranged outside the clean room 10, the clean room itself can be compact. In order to prevent dust from entering the clean room 10 from the environment beyond wall 11, the processing facilities 31 may be encapsulated by a housing 35 and/or the exits 11a and entries 11b may be carried out as a decoupling slot, e.g. as described in previous application WO/2011/028119. In the embodiment shown the turning facility 41 is arranged in the housing 35 together with the processing facilities 31.

As shown in FIG. 2A, a processing facility 31 may be composed of modules 31a, 31b, . . . 31n. A dryer facility may for example be composed of a plurality of dryer modules, each having a length L31x of 1.5 to 2 m. This makes it possible to easily adapt the dryer to the requirements set by the preceding deposition process. It is also possible to add additional processing facilities in the processing trajectory 31, without necessitating a rearrangement of the deposition facilities 21, 22.

In the embodiment shown the processing facilities 31 are arranged in a processing room 60. The processing room 60 typically has a clean room classification that is at least 10 higher than that of the clean room 10. For example, in the embodiment shown the clean room 10 has a clean room classification of 1000, while the processing room 60 has a classification of 10000 or higher. As indicated, the clean room 10 itself, having the most strict clean room classification, can be compact.

In an embodiment the area of the clean room 10 is only one third of the total area occupied by the clean room 10 and the processing room 60. By way of example the clean room 10 and the processing room 60 each have a width W of 10 to 40 m, while the processing room has a length L60 of 20 to 40 m and the clean room 10 has a length L10 of 5 to 15 m. For example the clean room 10 and the processing room 60 each have a width W of 20 m, while the processing room has a length L60 of 30 m and the clean room 10 has a length L10 of 8 m. Hence, the ratio of the area of the clean room 10 in comparison to the total area is about 0.21.

The arrangement of FIG. 2 having two deposition facilities 21, 22 and a single processing facility 31 can be easily extended with additional deposition facilities and processing facilities. Each next processing facility may be coupled to an output of a deposition facility via a redirection facility, similar as shown in FIG. 2. Likewise, each next deposition facility may be coupled to an output of a processing facility via a redirection facility 51 as shown in FIG. 2.

Figure 3:
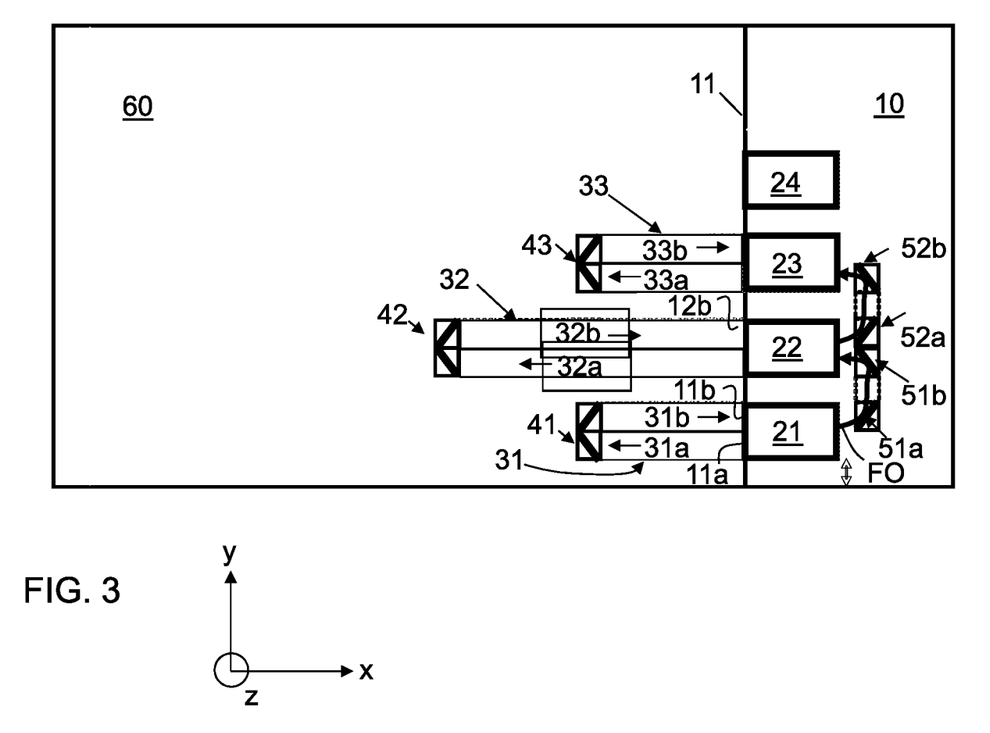
FIG. 3 shows a second embodiment of a manufacturing facility according to the present invention.

FIG. 3 shows a manufacturing facility for manufacturing a product on a foil FO, according to a second embodiment of the present invention. Parts therein corresponding to those in FIG. 2 have the same reference numeral.

In this case four deposition facilities 21-24 are arranged in the clean room 10. The manufacturing facility has processing facilities 32, 33 outside said clean room 10 for processing the deposited layers. Further processing facility 32 has a first path 32a in a first direction away from said clean room 10, towards a turning facility 42 and with a second path 32b from said turning facility back towards said clean room 10. Likewise further processing facility 33 has a first path 33a in a first direction away from said clean room 10, towards a turning facility 43 and with a second path 33b from said turning facility back towards said clean room 10.

Figure 4:
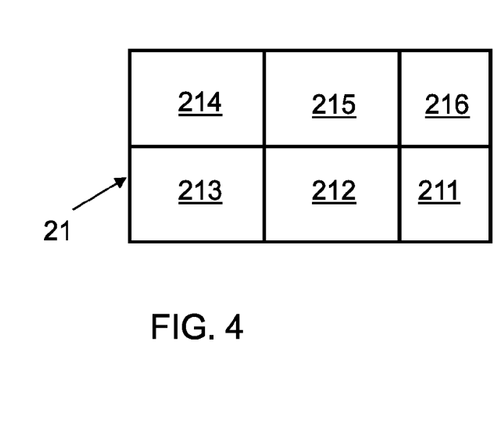

As shown in FIG. 4, a deposition facility e.g. 21 may comprise in addition to a deposition unit 213 for depositing a material as an optionally patterned, layer an unwinder unit 211, a first cleaning/alignment unit 212, a post cure unit 214, a second cleaning/alignment unit 215 and a winding unit 216. A post cure unit enables an additional curing of for example the OPV blend which might result in a higher efficiency (performance) of the PV cell. Before each deposition facility an alignment facility is (desirable necessary in order to correct the foil again to the desired position (traverse direction) and prevent in this way misalignment between subsequent processing steps.

The manufacturing facility further has a first and a second redirection facility 51a, b for redirecting the foil from the entry 11b of the clean room 10, towards the second deposition facility 22. On its path from the entry 11b to the redirecting facilities 51a, b the foil may be guided through units of the deposition facility, e.g. a post cure unit 214 or a second cleaning/alignment unit 215. As shown in FIG. 3, the manufacturing facility has further redirection facilities 52a, b for redirecting the foil from the entry 12b of the clean room 10 to further deposition facility 23.

In the embodiment shown only the first deposition facility 21 is provided with a winder unit 211 for providing the foil to be processed. The foil, for example a polymer like PEN or PET may already be prepared by cleaning or by application of a coating or the like. Only the last deposition facility 23 has a winder unit, equivalent to 216 for winding the foil. Typically a first cleaning/alignment unit 212 is arranged for cleaning and/or aligning the foil before deposition takes place. This unit 212 may be omitted if the foil is already clean, and an alignment is not necessary, for example in case the deposition process is a uniform deposition process.

An additional clean room may be present, e.g. on the other side of the clean room 10, opposite the processing zone 60 for additional manufacturing steps, e.g. roll to roll manufacturing steps as nano imprinting, and lamination. The additional clean room may have a less strict clean room classification than the clean room 10, for example a clean room classification that is at least 10 times higher than that of the clean room 10. For example the additional clean room may have a classification of 10000, in comparison to a classification of 1000 for the clean room.

Figure 3A:
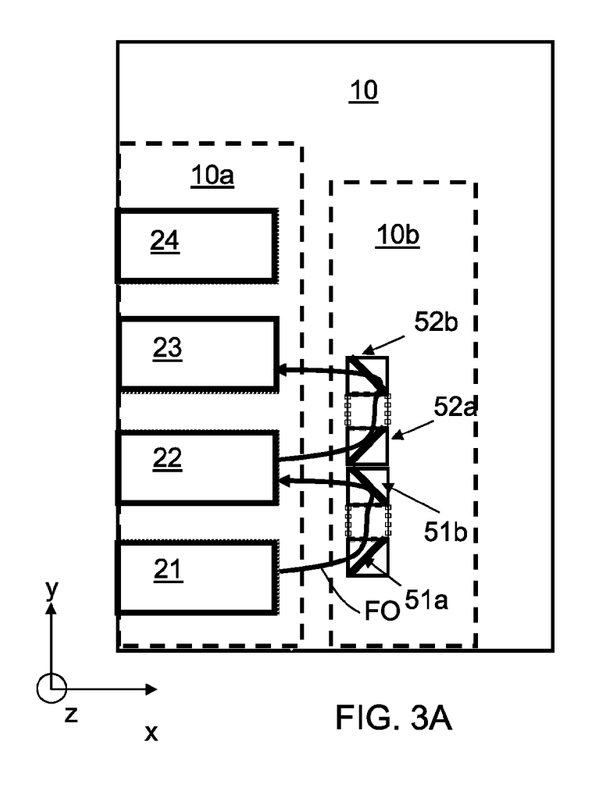
FIG. 3A shows a part of the second embodiment in more detail.

In the embodiment shown the processing room 60 has a height of 7 to 10 m, e.g. 8 m, while the clean room 10 and the additional clean room have a normal height, e.g. in the range of 2.5 to 3 m. The relatively large height of the processing room may be required for particular processing devices, such as polygon dryers. In the embodiment shown in FIG. 3, as shown in more detail in FIG. 3A, the manufacturing facility comprises a first sub-zone 10a in the clean room 10 wherein all deposition facilities 21-24, including the at least a first and a second deposition facility 21, 22 are arranged. The redirection facilities 51a, 51b, 52a, 52b, including the at least a first and a second redirection facility are arranged in a second sub-zone 10b of the clean room 10 that is disjunct from the first sub-zone 10a.

Figure 3B:
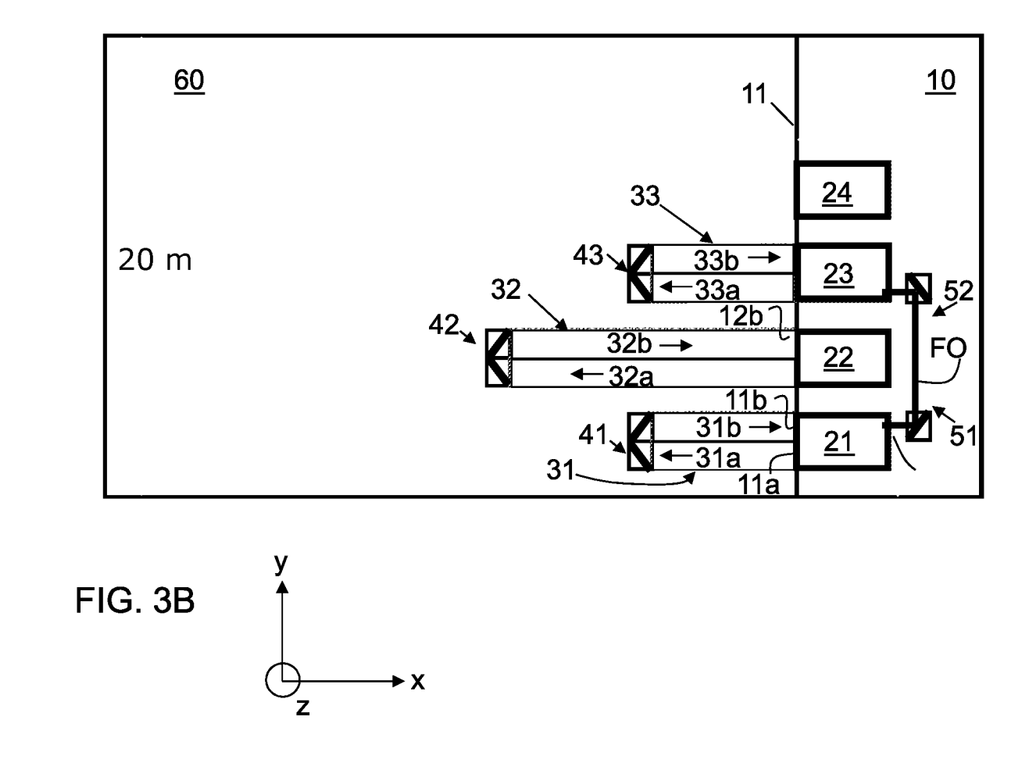
FIG. 3B shows a rearrangement of the manufacturing facility of FIG. 3A, FIG. 4 schematically shows an embodiment of a deposition facility, FIG. 5 schematically shows a part of a third embodiment of a manufacturing facility according to the present invention.

This embodiment is particularly advantageous as it even better facilitates a reconfiguration of the manufacturing facility. By way of example this is illustrated with reference to FIG. 3B. As in this arrangement the redirection facilities are arranged in the second sub-zone 10b, disjunct from the first sub-zone 10a, it is easy to select a subset of the deposition and processing facilities to obtain a particular product or particular variant of a product. For example in the embodiment shown in FIG. 3B, the redirection facility redirects the foil FO directly from the output of deposition facility 21 to the deposition facility 23, therewith skipping deposition facility 22 and processing facility 32. The redirecting facilities 51a, 51b, 52a, 52b may for example be arranged movably along a rail extending in the z-direction. Alternatively the redirecting facilities may removably coupled or be arranged movably in a z-direction so that they can be removed out of the path of the foil FO in the second sub-zone 10b.

Figures 5, 5A:
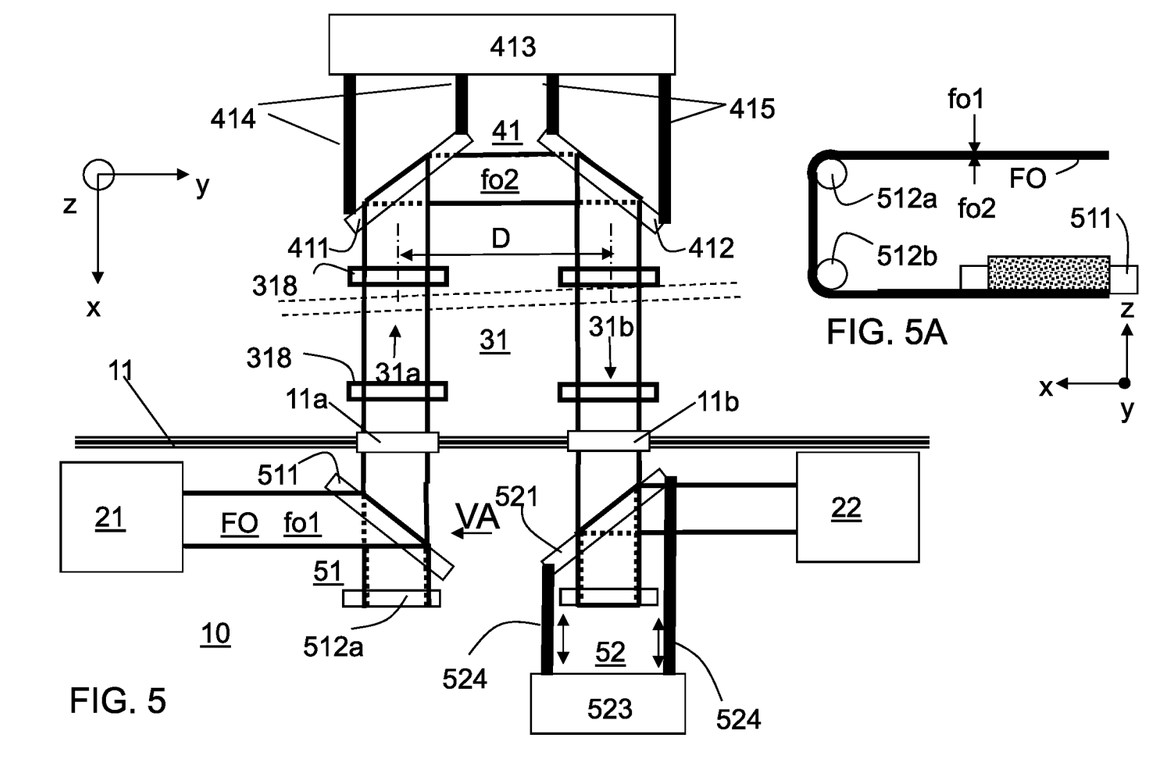

FIG. 5 shows in more detail an embodiment of a turning facility 41. The turning facility 41 comprises a first and a second guidance bar 411, 412 for the foil FO. The first and the second guidance bar 411, 412 each have a direction that is oblique with respect to the first direction 31a and the first and the second guidance bars 411, 412 are arranged transverse with respect to each other. This arrangement makes it possible to turn the foil FO from the first path 31a to the second path 31b at a relative short distance, while preventing contact with the coated side of the foil, i.e. the side of the foil FO carrying the deposited layer. The side of the foil opposite to the coated side slips over the surface of the guidance bar, or the guidance bar is provided with an air flotation bearing causing the foil to float over its surface.

In the embodiment shown the turning facility 41 comprises an alignment facility 413. The alignment facility 413 positions the guidance bars with a respective pair of support beams 414, 415 and therewith controls a relative distance D, defined between the centre line in the first direction 31a (−x) and the second direction 31b (x) of the foil. In the embodiment shown, the first and the second path 31a, 31b of the processing facility 31 are arranged parallel to each other at a distance D less than 20 times. In a more preferred embodiment, the distance D may even be smaller than 10 times a width of the foil FO.

The embodiment shown comprises a redirection facility 51 with a redirection bar 511 and a pair of turning rolls 512a,b of which only the upper one is shown in FIG. 5. A side view according to VA in FIG. 5 is shown in FIG. 5A. The foil FO has a front side fo1 that is provided with an (optionally patterned) layer by depositing facility 21. The foil is subsequently redirected by the redirection bar 511 from a direction +y to a direction +x. After redirection the back side fo2 of the foil faces upwards. The foil FO is subsequently redirected in a −x direction, in the direction of the deposition facility 31 by the pair of turning rolls 512 a,b. Therewith the foil FO is turned with its front side fo1 upwards again, so that the foil can be supported on its back side fo2 by supporting rolls 318.

In the embodiment shown the redirection facility 52 also is provided with an alignment facility 523. The redirection facility 52 comprises a guidance bar 521 that is supported by a pair of support beams 524, controlled by the alignment facility 523. In this way the turning facility 41 and the redirection facility 52 also serve to align the foil FO. The alignment facilities 413, 523 for example each comprise a position sensor for sensing a position of the foil, an actuator for moving the support beams 414, 415, 524 and a controller, e.g. a PID controller for controlling the actuator on the basis of the data obtained from the sensor.

As shown in FIG. 5A, all parts of the redirection facility 51, i.e. the redirection bar 511 and the turning rolls 512a,b support the foil FO on its back-side fo2, therewith preventing contact with the coated side fo1 of the foil. Similarly the guidance bars 411, 412 of the turning facility support the foil FO on its back-side fo2. This also applies to the supporting rolls 318. Apart from the additional alignment facility 523 the redirection facility 52 is identical to the redirection facility 51. Therewith it is realized in the arrangement according to the present invention that contact with the coated front-side fo1 of the foil FO is avoided along the entire processing trajectory.

Figure 6:
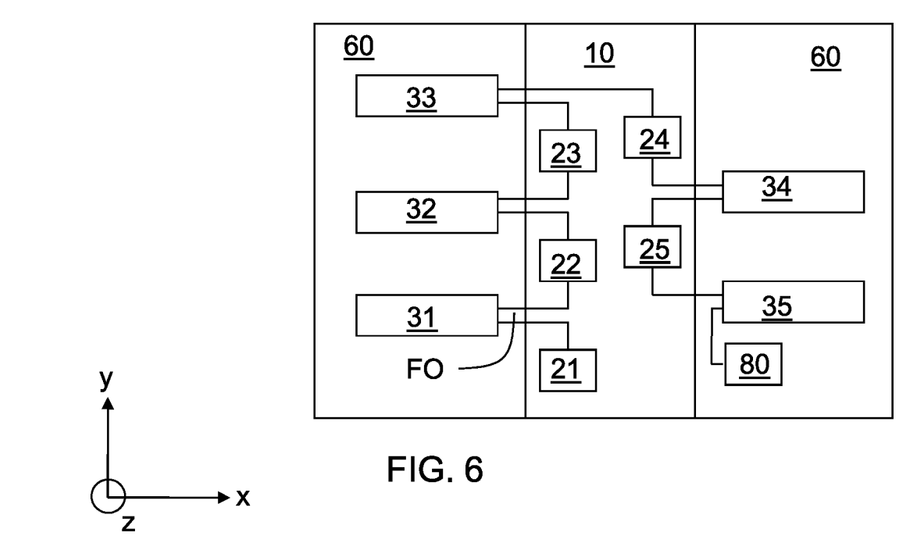
FIG. 6 shows a fourth embodiment of a manufacturing facility according to the present invention.

FIG. 6 shows a fourth embodiment of a manufacturing facility according to the present invention. In the embodiment of FIG. 6, the manufacturing facility has a processing zone 60 on mutually opposite sides of the deposition zone 10. The foil FO is guided subsequently along deposition facilities 21, 22, 23, 24, 25 via processing facilities 31, 32, 33 and 34. From deposition facility 25 the foil FO is guided via processing facility 35 to a packaging facility 80.

Figure 7:
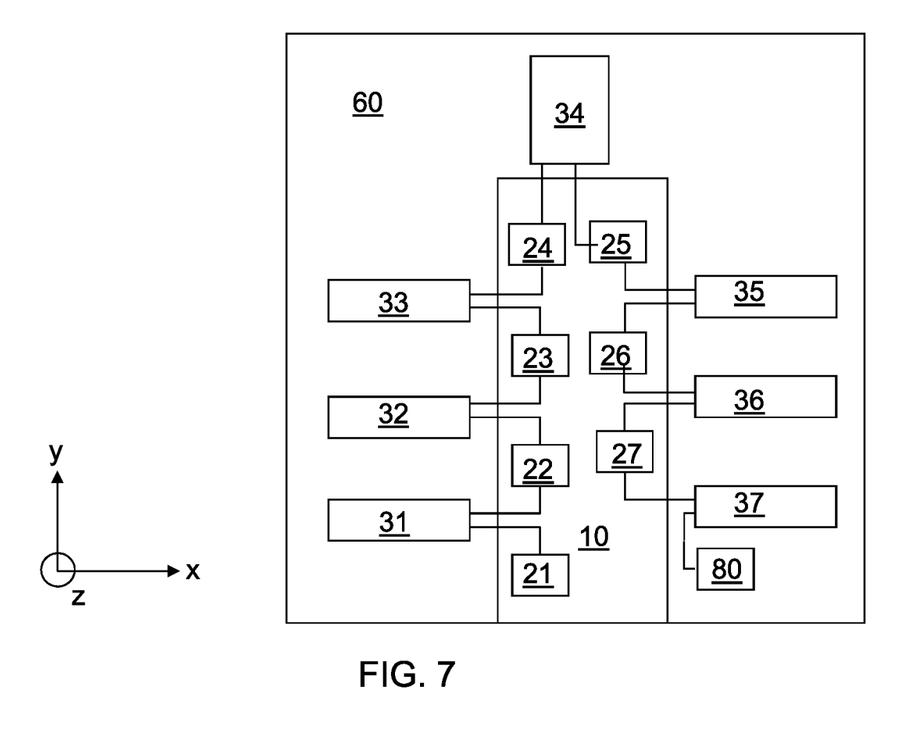
FIG. 7 shows a fifth embodiment of a manufacturing facility according to the present invention.

FIG. 7 shows a fifth embodiment of a manufacturing facility according to the present invention. Therein the manufacturing facility comprises a processing zone 60 that extends as a U-shape around the deposition zone 10. The foil FO is guided subsequently along deposition facilities 21, 22, 23, 24, 25, 26, 27 via processing facilities 31, 32, 33 34, 35 and 36. From deposition facility 27 the foil FO is guided via processing facility 37 to a packaging facility 80.

Figure 8:
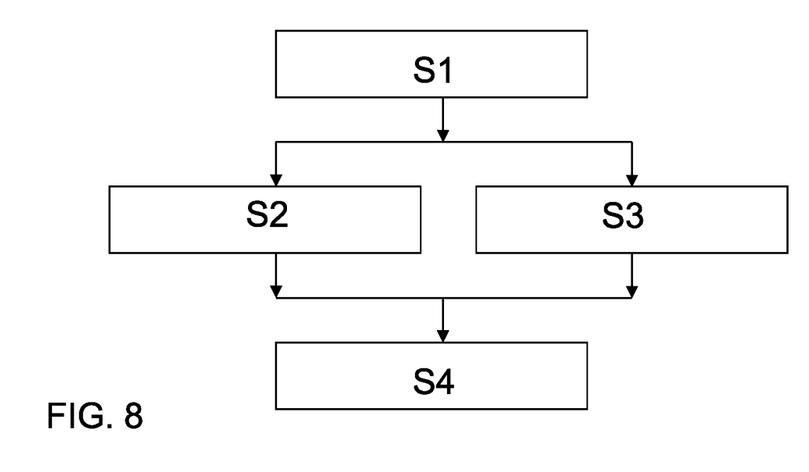
FIG. 8 shows a method of manufacturing according to the second aspect of the invention.

FIG. 8 schematically shows a method according to the second aspect for manufacturing a product on a foil. The method comprises the steps of in a deposition zone depositing S1 a first layer on the foil with a first deposition step, guiding S2 the foil with said first layer outside the deposition zone along a first path in a first direction away from said deposition zone and turning back along a second path towards said deposition zone, while processing S3 said first layer along the first and/or the second path, after return to said deposition zone depositing S4 a second layer on the foil with a second deposition step.

In the claims the word "comprising" does not exclude other elements or steps, and the indefinite article "a" or "an" does not exclude a plurality. A single component or other unit may fulfill the functions of several items recited in the claims. Any reference signs in the claims should not be construed as limiting the scope.

The invention claimed is:

1. A manufacturing facility for manufacturing a product on a foil, the manufacturing facility comprising a deposition zone wherein a first deposition facility is arranged for depositing a layer of a material on the foil, the manufacturing facility further comprising at least one processing facility for processing the deposited layer, said at least one processing facility being arranged outside said deposition zone and comprising a processing trajectory with a first path in a first direction away from said deposition zone, towards a turn, and away from the turn towards a second path back towards said deposition zone, the manufacturing facility configured for redirecting the foil within the deposition zone wherein the deposition zone is a clean room having an exit and an entry, wherein said first path leads in a first direction away from said exit and said second path leads back towards said entry, wherein at least one second deposition facility is arranged in the deposition zone, the foil being guided along said first and said at least a second deposition facility via the at least one processing facility, and wherein the processing trajectory is enclosed by a housing, arranged in a processing room, the processing room having a clean room classification that is at least 10 times higher than that of the clean room.

2. The manufacturing facility according to claim 1, wherein said redirecting of the foil within said deposition zone is towards an input of the at least one second deposition facility.

3. The manufacturing facility according to claim 1, wherein the deposition zone comprises a first sub-zone wherein the first and the at least one second deposition facility are arranged and a second sub-zone is configured for said redirecting of the foil within said deposition zone, the second sub-zone being disjunct from the first sub-zone.

4. The manufacturing facility according to claim 1, comprising at least three deposition facilities that are mutually arranged in-line.

5. The manufacturing facility according to claim 1, wherein the first and the second path of the at least one processing facility are arranged parallel to each other at a distance of at most twenty times a width of the foil.

6. The manufacturing facility according to claim 1, wherein said turn comprises a first and a second guidance bar for the foil, each having a direction that is oblique with respect to the first direction and the first and the second guidance bars being arranged transverse with respect to each other.

7. The manufacturing facility according to claim 1, wherein said turn and said processing facility share a common housing.

8. The manufacturing facility according to claim 1, comprising an alignment facility that is integrated with said turn and/or is configured for said redirecting of the foil within said deposition zone.

9. The manufacturing facility according to claim 1, wherein the first deposition facility and/or the at least one second deposition facility are selected from the group consisting of a printing facility and a coating facility.

10. The manufacturing facility according to claim 1, wherein the at least one processing facility is selected from the group consisting of a drying facility, a sintering facility, an annealing facility, a curing facility, a fusing facility, and an ablation facility.

11. The manufacturing facility according to claim 1, wherein one or more of the first and the at least one second deposition facility comprises in addition to a deposition unit for depositing a layer on the foil, one or more of an unwind unit, a first cleaning and/or alignment unit, a first alignment unit, a post cure, an inspection unit, a second cleaning and/or alignment unit and a winding unit.

12. The manufacturing facility according to claim 1, wherein said processing trajectory is arranged in a processing room, and wherein the area of the clean room is at most one third of the total area occupied by the clean room and the processing room.

13. The manufacturing facility according to claim 1, wherein said turn comprises air flotation bearings.

14. A method for manufacturing a product on a foil, comprising the steps of in a deposition zone being a clean room depositing a first layer on the foil with a first deposition step, guiding the foil with said first layer outside the deposition zone along a first path in a first direction away from said deposition zone and turning back along a second path towards said deposition zone, while processing said first layer along the first and/or the second path, wherein the first path and the second path are enclosed by a housing, arranged in a processing room, the processing room having a clean room classification that is at least 10 times higher than that of the clean room, and depositing a second layer on the foil with a second deposition step after return to the deposition zone.

15. The manufacturing facility according to claim 5, wherein the distance is at most ten times the width of the foil.

* * * * *

UNITED STATES PATENT AND TRADEMARK OFFICE
CERTIFICATE OF CORRECTION

PATENT NO. : 9,610,602 B2  
APPLICATION NO. : 14/376955  
DATED : April 4, 2017  
INVENTOR(S) : Ike Gerke De Vries et al.

Page 1 of 1

It is certified that error appears in the above-identified patent and that said Letters Patent is hereby corrected as shown below:

On the Title Page

Under "(72): Inventors:"  
Please delete "Arjan Langen" and replace with --Adrianus Petrus Langen--

Signed and Sealed this  
Fourth Day of July, 2017

Joseph Matal  
*Performing the Functions and Duties of the*  
*Under Secretary of Commerce for Intellectual Property and*  
*Director of the United States Patent and Trademark Office*